United States Patent
Ding et al.

(10) Patent No.: US 9,166,530 B2
(45) Date of Patent: Oct. 20, 2015

(54) LOW NOISE AMPLIFIER AND RECEIVER

(71) Applicant: ADVANCED SEMICONDUCTOR ENGINEERING INC., Kaohsiung (TW)

(72) Inventors: Jaw-Ming Ding, Taoyuan County (TW); Chien-Yeh Liu, Hsinchu County (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 72 days.

(21) Appl. No.: 14/214,983

(22) Filed: Mar. 16, 2014

(65) Prior Publication Data
US 2015/0263675 A1    Sep. 17, 2015

(51) Int. Cl.
*H04B 1/26*    (2006.01)
*H03F 1/02*    (2006.01)
*H03F 3/19*    (2006.01)

(52) U.S. Cl.
CPC .............. *H03F 1/0211* (2013.01); *H03F 3/19* (2013.01); *H03F 2200/294* (2013.01); *H03F 2200/451* (2013.01)

(58) Field of Classification Search
CPC .............. H04B 1/16; H03F 2200/451; H03F 2200/294
USPC ........ 455/130, 190.1, 194.2, 195.1, 311, 312, 455/341, 343.1
See application file for complete search history.

(56) References Cited

U.S. PATENT DOCUMENTS

| | | | |
|---|---|---|---|
| 2007/0202814 A1* | 8/2007 | Ono et al. | 455/78 |
| 2010/0203847 A1* | 8/2010 | Gorbachov | 455/84 |
| 2012/0231729 A1* | 9/2012 | Xu et al. | 455/13.4 |

FOREIGN PATENT DOCUMENTS

| | | |
|---|---|---|
| CN | 103166581 A | 6/2013 |
| CN | 103248324 A | 8/2013 |

* cited by examiner

*Primary Examiner* — Tuan Pham
(74) *Attorney, Agent, or Firm* — Foley & Lardner LLP; Cliff Z. Liu; Angela D. Murch

(57) ABSTRACT

A low noise amplifier is disclosed. The low noise amplifier comprises a current mirror circuit, a bias circuit, a cascode amplifying circuit and a power gain compensating circuit. The current mirror circuit is used for providing a mapping current. The bias circuit is used for receiving a mapping current and outputting a first bias voltage and a second bias voltage according to the mapping current. The cascode amplifying circuit respectively receives the first bias voltage and the second bias voltage, and accordingly to work at an operation bias point. The power gain compensating circuit is used for receiving a RF output signal and accordingly outputs a gain compensating signal to the current mirror circuit so as to dynamically adjust current value of the mapping current and further to compensates power gain of the low noise amplifier in order to increase linearity.

12 Claims, 6 Drawing Sheets

LOW NOISE AMPLIFIER AND RECEIVER

BACKGROUND OF THE INVENTION

1. Field of the Invention

The instant disclosure relates to a low noise amplifier; in particular, to a low noise amplifier that can dynamically adjust the bias point.

2. Description of Related Art

The wireless communication has developed dramatically. Nowadays, there are over 1 billion wireless mobile devices in the world. There are many bandwidths and communication protocols for mobile network, wide area network (WAN), local area network (LAN), public safety communication and military communication, which is hard to have the best implementation.

The Low Noise Amplifier (LNA) is generally used in the communication system, which is used for amplifying weak input signal received from antenna to be a signal with low noise. Moreover, the Low Noise Amplifier (LNA) is often configured at the front end of a communication system. Generally speaking, the Low Noise Amplifier (LNA) can reduce most of the noise and amplify the desired signals with frequencies near a center frequency. Therefore, it not only can increase the Signal-to-Noise Ratio (SNR) of the communication system, but also can increase quality of signal receiving. In the prior art, in conjunction with FIG. 1 and FIG. 2, FIG. 1 shows a circuit diagram of a traditional low noise amplifier and FIG. 2 shows a simulation waveform of a traditional low noise amplifier. When input power of the RF input signal increases, power gain of the traditional LNA may decrease from −25 dBm, and 1 dB gain compression point thereof is −15.5 dBm.

SUMMARY OF THE INVENTION

The instant disclosure provides a low noise amplifier. The low noise amplifier comprises a current mirror circuit, a bias circuit, a cascode amplifying circuit and a power gain compensating circuit. The current mirror circuit is used for providing a mapping current. The bias circuit is electrically connected to the current mirror circuit and is used for receiving a mapping current and outputting a first bias voltage and a second bias voltage according to the mapping current. The cascode amplifying circuit is electrically connected to the bias circuit so as to respectively receive the first bias voltage and the second bias voltage, and accordingly to work at an operation bias point. The cascode amplifying circuit is used for receiving and amplifying a RF input signal and accordingly outputs a RF output signal. The power gain compensating circuit is electrically connected between the cascode amplifying circuit and the current mirror circuit. The power gain compensating circuit is used for receiving the RF output signal and accordingly outputs a gain compensating signal to the current mirror circuit so as to dynamically adjust current value of the mapping current and further to compensates power gain of the low noise amplifier in order to increase linearity.

In an embodiment of the instant disclosure, current value of the mapping current increases correspondingly with power of the RF input signal, so as to dynamically adjust voltage values of the first bias voltage and the bias circuit outputted by the bias circuit.

In an embodiment of the instant disclosure, the bias circuit comprises a first transistor and a second transistor. The first transistor has drain and gate connected together, has source connected to a ground voltage and outputs the first bias voltage to the cascode amplifying circuit via a first resistor. The second transistor has drain and gate connected together and receiving the mapping current, has source connected to drain of the first transistor. Drain of the second transistor outputs the second bias voltage to the cascode amplifying circuit. Particularly, the first transistor and the second transistor dynamically adjust voltage value of the first bias voltage and the second bias voltage respectively according to current value of the mapping current.

In an embodiment of the instant disclosure, the cascode amplifying circuit comprises an input capacitor, a third transistor, a fourth transistor, an output capacitor and an inductor. The input capacitor has one terminal receiving the RF input signal. The third transistor has gate connected to source of the first transistor via the first resistor, receives the first bias voltage and is directly connected to another terminal of the input capacitor so as to receive the RF input signal. The third transistor has source connected to the ground voltage. The fourth transistor has gate connected to drain of the second transistor and receiving the second bias voltage and has source connected to drain of the third transistor. The output capacitor, having one terminal connected to drain of the fourth transistor has another terminal outputting the RF output signal. The inductor has one terminal connected to drain of the fourth transistor, and has another terminal connected to a system voltage. In particular, the third transistor and the fourth transistor according to the first bias voltage and the second bias voltage respectively work at the operation bias point, used for receiving and amplifying the RF input signal and accordingly outputting the RF output signal.

In an embodiment of the instant disclosure, the power gain compensating circuit comprises a compensation capacitor. The compensation capacitor has one terminal connected to drain of the fourth transistor and has another terminal connected to the current mirror circuit. The compensation capacitor receives the RF output signal and accordingly outputs the gain compensating signal to the current mirror circuit so as to dynamically adjust current value of the mapping current. Particularly, the gain compensating signal is the output signal.

In an embodiment of the instant disclosure, the current mirror circuit comprises a bias current source, a fifth transistor and a sixth transistor. The bias current source has one terminal connected to the ground voltage and the bias current source has a preset current. The fifth transistor has gate and drain connected together, is connected to another terminal of the bias current source and has source connected to the system voltage. The sixth transistor has gate connected to another terminal of the compensation capacitor so as to receive the gain compensating signal, has drain connected to drain of the second transistor and outputting the mapping current and has source connected to the system voltage. In particular, gate of the sixth transistor equals to voltage of the gain compensating signal. Also, the sixth transistor dynamically adjusts gate voltage according to the gain compensating signal and further dynamically adjusts current value of the mapping current.

The instant disclosure further provides a receiver. A receiver comprises a low noise amplifier, a demodulation circuit and a load. The low noise amplifier is used for receiving a RF input signal and outputting a RF output signal. The demodulation circuit is electrically connected to the low noise amplifier and is used for demodulating the RF output signal and outputting a demodulation signal. The load is electrically connected to the demodulation circuit and receives the demodulation signal. In particular, the low noise amplifier comprises a current mirror circuit, a bias circuit, a cascode amplifying circuit and a power gain compensating circuit. The current mirror circuit is used for providing a mapping current. The bias circuit is electrically connected to the current mirror circuit and is used for receiving a mapping current and outputting a first bias voltage and a second bias voltage according to the mapping current. The cascode amplifying circuit is electrically connected to the bias circuit so as to respectively receive the first bias voltage and the second bias voltage, and accordingly to work at an operation bias point. The cascode amplifying circuit is used for receiving and amplifying a RF input signal and accordingly outputs a RF output signal. The power gain compensating circuit is electrically connected between the cascode amplifying circuit and the current mirror circuit. The power gain compensating circuit is used for receiving the RF output signal and accordingly outputs a gain compensating signal to the current mirror circuit so as to dynamically adjust current value of the mapping current and further to compensates power gain of the low noise amplifier in order to increase linearity.

To sum up, the low noise amplifier and the receiver provided by the instant disclosure feedbacks the RF output signal to the current mirror circuit via the power gain compensating circuit so as to dynamically adjust the mapping current, which thereby compensates power gain of the low noise amplifier in order to increase linearity, in other words, to increase 1 dB gain compression point (P1dB).

For further understanding of the instant disclosure, reference is made to the following detailed description illustrating the embodiments and examples of the instant disclosure. The description is only for illustrating the instant disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF PREFERRED EMBODIMENTS

It will be understood that, although the terms first, second, third, and the like, may be used herein to describe various elements, components, regions, layers and/or sections, these elements, components, regions, layers and/or sections should not be limited by these terms. These terms are only to distinguish one element, component, region, layer or section from another region, layer or section discussed below could be termed a second element, component, region, layer or section without departing from the teachings of the instant disclosure. As used herein, the term "and/or" includes any and all combinations of one or more of the associated listed items.

It will be understood that, although the terms first, second, third, and the like, may be used herein to describe various elements, components, regions, layers and/or sections, these elements, components, regions, layers and/or sections should not be limited by these terms. These terms are only to distinguish one element, component, region, layer or section from another region, layer or section discussed below could be termed a second element, component, region, layer or section without departing from the teachings of the instant disclosure. As used herein, the term "and/or" includes any and all combinations of one or more of the associated listed items.

In the following instruction, a plurality of embodiments together with drawings are for illustrating the low noise amplifier; however, the embodiments are not taken as limitations for the instant disclosure.

[One Embodiment of the Low Noise Amplifier]

Figure 1:
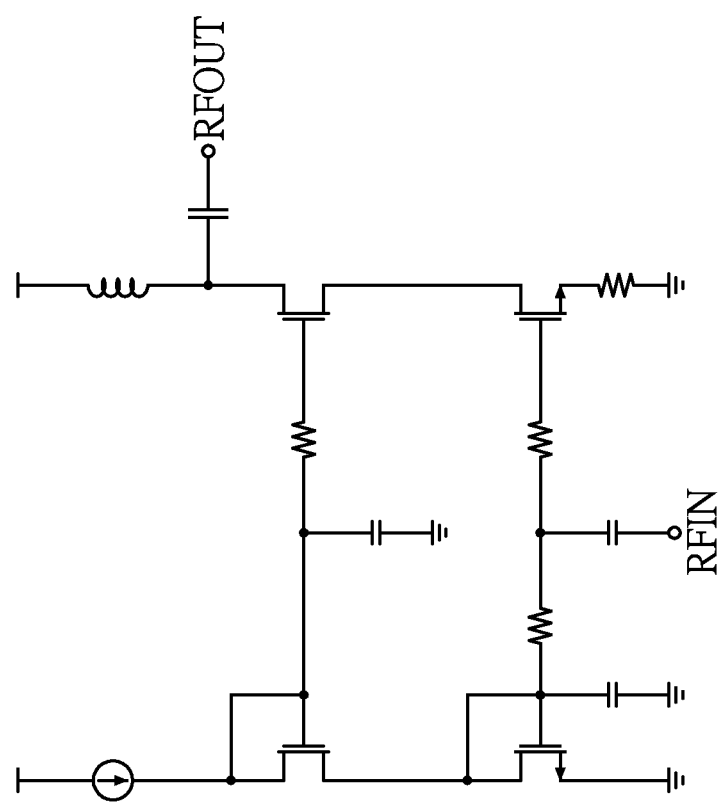
FIG. 1 shows a circuit diagram of a traditional low noise amplifier.
Figure 2:
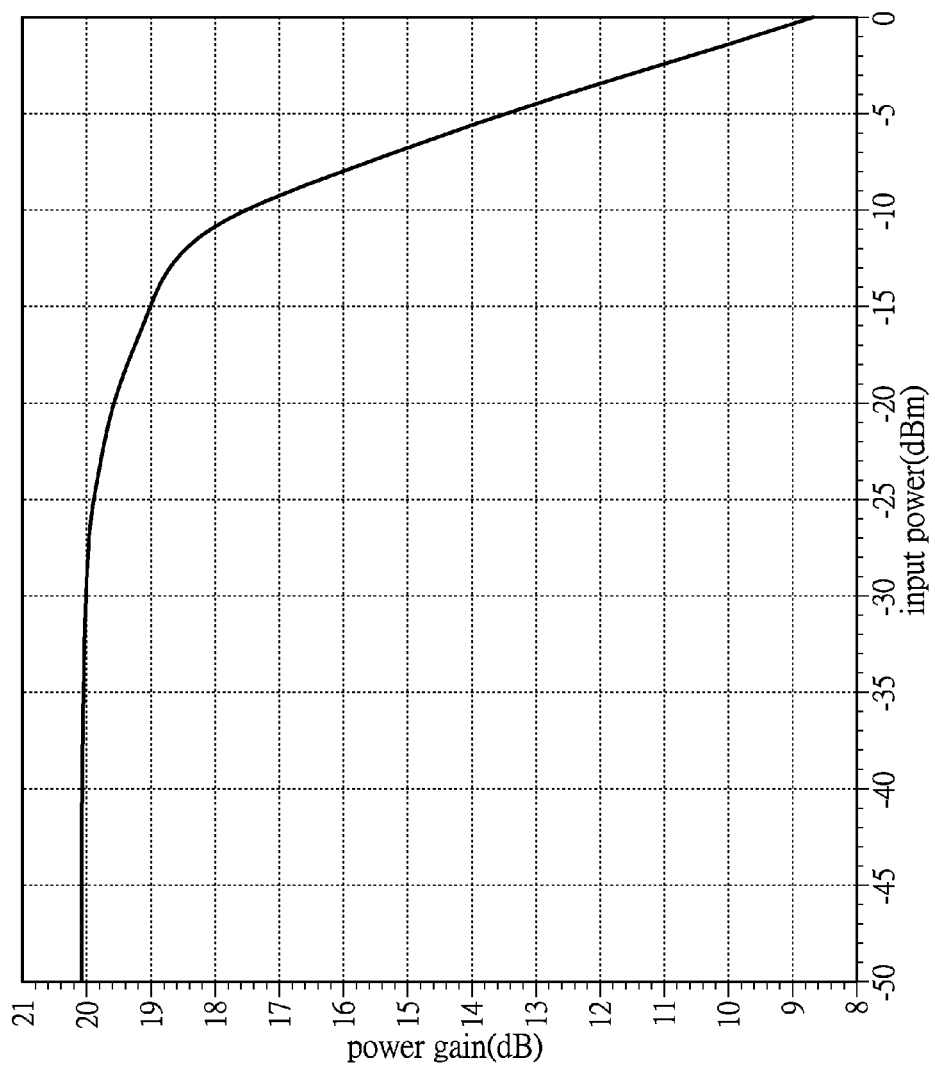
FIG. 2 shows a simulation waveform of a traditional low noise amplifier.
Figure 3:
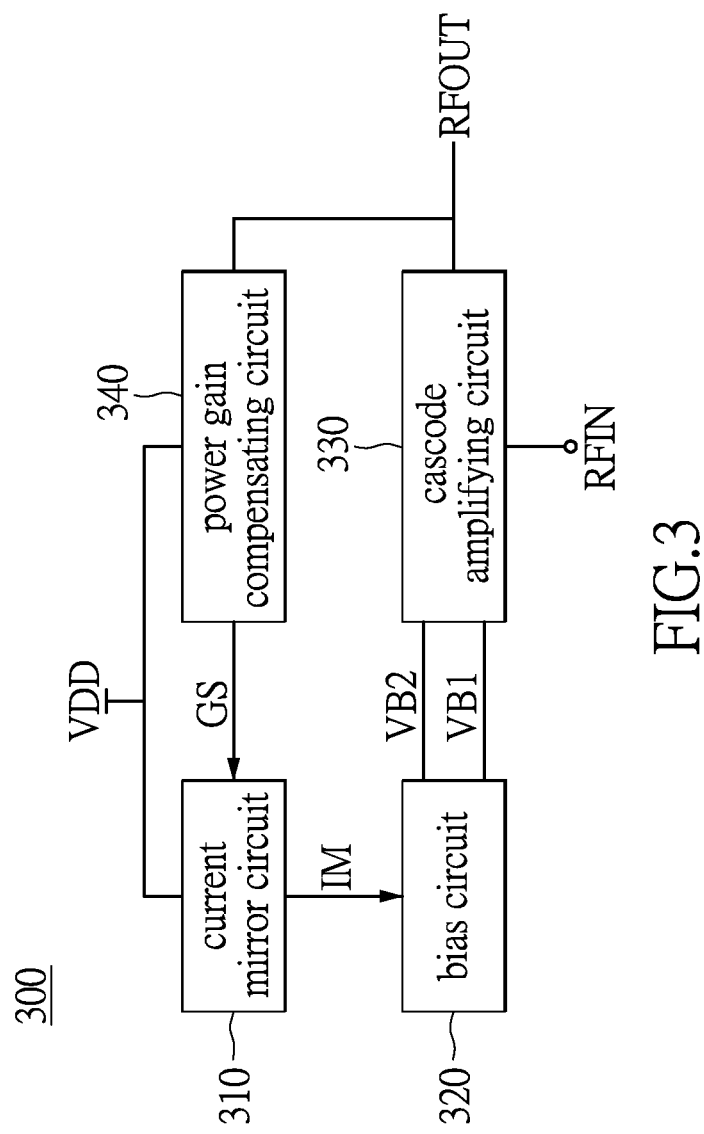
FIG. 3 shows a schematic block diagram of a low noise amplifier according to an embodiment of the instant disclosure.

Please refer to FIG. 3, FIG. 3 shows a schematic block diagram of a low noise amplifier 300 according to an embodiment of the instant disclosure. As shown in FIG. 3, the low noise amplifier 300 comprises a current mirror circuit 310, a bias circuit 320, a cascode amplifying circuit 330 and a power gain compensating circuit 340. The current mirror circuit 310 is electrically connected to the bias circuit 320 and the system voltage VDD. The bias circuit 320 is electrically connected to the cascode amplifying circuit 330. The cascode amplifying circuit 330 is electrically connected to the power gain compensating circuit 340, and the power gain compensating circuit 340 is electrically connected to the current mirror circuit 310.

Regarding to the current mirror circuit 310 of the instant disclosure is mainly used for providing the mapping current IM according to the bias current source inside (not shown in FIG. 3).

Regarding to the bias circuit 320, the bias circuit 320 is used for receiving the mapping current IM and correspondingly outputting the first bias voltage VB1 and the second bias voltage VB2 according to the mapping current IM. Moreover, in the present embodiment, the bias circuit 320 is used for biasing the cascode amplifying circuit 330 at a proper operation bias point.

Regarding to the cascode amplifying circuit 330, the cascode amplifying circuit 330 is used for respectively receiving the first bias voltage VB1 and the second bias voltage VB2 transmitted by the bias circuit 320. Also, the cascode amplifying circuit 330 works at the operation bias point respectively according to voltage values of the first bias voltage VB1 and the second bias voltage VB2. In addition, the cascode amplifying circuit 330 is used for receiving and amplifying the RF input signal RFIN and outputting the RF output signal RFOUT.

Regarding to the power gain compensating circuit 340, the power gain compensating circuit 340 is used for receiving the RF output signal RFOUT, and outputting the corresponding gain compensating signal GS to the current mirror circuit 310 according to voltage value or power value of the RF output signal RFOUT, so as to dynamically adjust current value of the mapping current IM correspondingly, which further compensates power gain of the low noise amplifier 300 in order to increase linearity.

In the following description is further instruction in teaching a work mechanism of the low noise amplifier 300.

To be detailed, in the present embodiment, current value of the mapping current IM received by the bias circuit 320 determines voltage value of the first bias voltage VB1 and the second bias voltage VB2. Also, voltage value of the first bias voltage VB1 and the second bias voltage VB2 determines the operation bias point of the cascode amplifying circuit 330 and further determines linearity and power gain of the cascode amplifying circuit 330. Moreover, linearity of a general low noise amplifier decreases with input power of the RF input signal increased, which results in a decrease of power gain of the low noise amplifier. Therefore, the instant disclosure provides a low noise amplifier 300 that can dynamically adjusts the bias point with the increase of input power of the RF input signal RFIN. In a further instruction, when input power of the RF input signal RFIN received by the cascode amplifying circuit 330 increases, the low noise amplifier 300 receives the RF output signal RFOUT via power gain compensating circuit and correspondingly outputs the gain compensating signal GS to the current mirror circuit so as to dynamically adjust (or increase) current value of the mapping current IM. Afterwards, the bias circuit dynamically adjusts (or increases) voltage values of the first bias voltage VB1 and the second bias voltage VB2 according to current value of the mapping current IM, which thereby compensates power gain of the low noise amplifier 300 in order to increase linearity of the communication circuit, that is, to increase the 1 dB gain compression point (P1dB). In other words, current value of the mapping current IM increases correspondingly with input power of the RF input signal RFIN increased, which thereby dynamically adjusts voltage values of the first bias voltage VB1 and the second bias voltage VB2 outputted by the bias circuit 320.

For a specific instruction on an operation process of the low noise amplifier 300 of the instant disclosure, there is at least one of the embodiments for further instruction.

In the following embodiments, there are only parts different from embodiments in FIG. 3 described, and the omitted parts are indicated to be identical to the embodiments in FIG. 3. In addition, for an easy instruction, similar reference numbers or symbols refer to elements alike.

[Another Embodiment of the Low Noise Amplifier]

Figure 4:
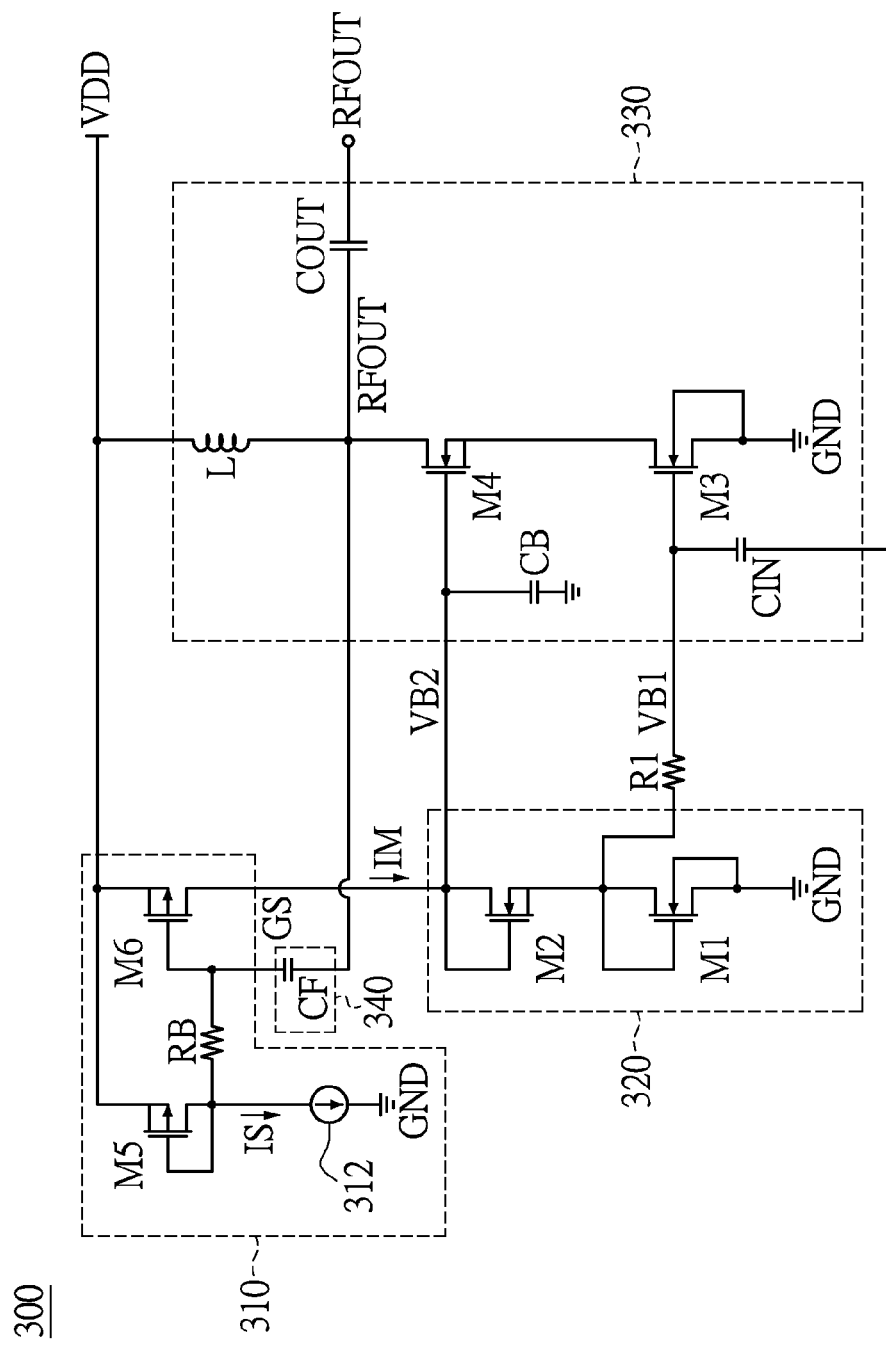
FIG. 4 shows a detailed circuit diagram of a low noise amplifier according to an embodiment of the instant disclosure.

Please refer to FIG. 4, FIG. 4 shows a detailed circuit diagram of a low noise amplifier according to an embodiment of the instant disclosure. Different from the embodiment shown in FIG. 3, in the low noise amplifier 300 of the present embodiment, the bias circuit 320 comprises a first transistor M1 and a second transistor M2. The cascode amplifying circuit 330 comprises an input capacitor CIN, a third transistor M3, a fourth transistor M4, an output capacitor COUT and an inductor L. The power gain compensating circuit 340 comprises a compensation capacitor CF. The current mirror circuit 310 comprises a bias current source 312, a fifth transistor M5 and a sixth transistor M6. In the present embodiment, if the low noise amplifier 300 is in a DC mode, the input capacitor CIN, the output capacitor COUT and the compensation capacitor CF are viewed as open circuits; if the low noise amplifier 300 is in an AC mode, the input capacitor CIN, the output capacitor COUT and the compensation capacitor CF are viewed as short circuits.

Drain and gate of the first transistor M1 are connected together. Drain of the first transistor 1 is connected to the ground voltage GND and outputs the first bias voltage VB1 to the cascode amplifying circuit 330 via the first resistor R1. Drain and gate of the second transistor M2 are connected together and receives the mapping current IM. Source of the second transistor M2 is connected to drain of the first transistor M1, and drain of the second transistor M2 outputs the second bias voltage VB2 to the cascode amplifying circuit 330. It needs to be noticed that, the first transistor M1 and the second transistor M2 of the present embodiment have diode configurations. One terminal of the input capacitor CIN is used for receiving the RF input signal RFIN. Gate of the third transistor M3 is connected to drain of the first transistor M1 via the first resistor R1, receives the first bias voltage VB1 and is directly connected to another terminal of the input capacitor CIN so as to receive the RF input signal RFIN. Source of the third transistor M3 is connected to the ground voltage GND. Gate of the fourth transistor M4 is connected to drain of the second transistor M2 and receives the second bias voltage VB2. Source of the fourth transistor M4 is connected to drain of the third transistor M3. One terminal of the output capacitor COUT is connected to drain of the fourth transistor M4, and another terminal of the output capacitor COUT outputs the RF output signal RFOUT. One terminal of the inductor L is connected to drain of the fourth transistor M4, another terminal of the inductor L is connected to the system voltage VDD. One terminal of the compensation capacitor CF is connected to drain of the fourth transistor M4, another terminal of the compensation capacitor CF is connected to the current mirror circuit 310. One terminal of the bias current source 312 is connected to the ground voltage GND and the bias current source 312 has a preset current IS. Gate and drain of the fifth transistor M5 are connected together and then connected to another terminal of the bias current source 312, and source of the fifth transistor M5 is connected to the system voltage VDD, wherein the fifth transistor has a diode configuration. Gate of the sixth transistor M6 is connected to another terminal of the compensation capacitor CF so as to receive the gain compensating signal GS. Drain of the sixth transistor M6 is connected to drain of the second transistor M2 and outputs the mapping current IM, and source of the sixth transistor M6 is connected to the system voltage VDD.

In the following description is further instruction in teaching a work mechanism of the low noise amplifier 300.

In the present embodiment, the designer can set the ratio of the fifth transistor M5 and the sixth transistor M6 (larger than 1) so as to determine the ratio of the mapping current IM and the preset current. Afterwards, via circuit topology of the low noise amplifier 300 described above, the instant disclosure can dynamically adjust the mapping current IM via feeding back the RF output signal RFOUT from output terminal of the low noise amplifier 300 to the sixth transistor M6. To be detailed, the third transistor M3 and the fourth transistor M4 works at the operation bias point according to the first bias voltage VB1 and the second bias voltage VB2 respectively. When the low noise amplifier 300 enters into AC mode and receives the RF input signal RFIN, that is, gate of the third transistor M3 receives the RF input signal RFIN, the third transistor M3 and the fourth transistor M4 amplifies input power of the RF input signal RFIN, and drain of the fourth transistor M4 outputs the RF output signal RFOUT. With the input power of the RF input signal RFIN increased, in order to increase the 1 dB gain compression point (P1dB) for maintaining or increasing linearity of the low noise amplifier 300, the compensation capacitor CF receives the RF output signal RF and accordingly outputs the gain compensating signal GS to the current mirror circuit 310 so as to dynamically adjust current value of the mapping current IM correspondingly. In other words, the instant disclosure feeds back the RF output signal RFOUT to gate of the sixth transistor M6 via the compensation capacitor CF so as to increase gate alternative current (ac) voltage of the sixth transistor M6 and further increase direct current (dc) current value of the mapping current IM. Particularly, the gain compensating signal GS is the RF output signal RFOUT and ac component of gate voltage (i.e., gate ac voltage) of the sixth transistor M6 is increased according to the gain compensating signal GS, which further dynamically adjusts current value (i.e., dc component) of the mapping current IM. After that, the first transistor M1 and the second transistor M2 dynamically adjusts (or increases) voltage values of the first bias voltage VB1 and the second bias voltage VB2 which are respectively provided to the third transistor M3 and the fourth transistor M4 by the first transistor M1 and the second transistor according to the increased current value of the mapping current IM, and linearity of the low noise amplifier 300 is thereby increased. It is worth mentioning that, the transistors M1~M4 are NMOS transistors and the transistors M5 and M6 are PMOS transistors, which are based on CMOS process.

Figure 5:
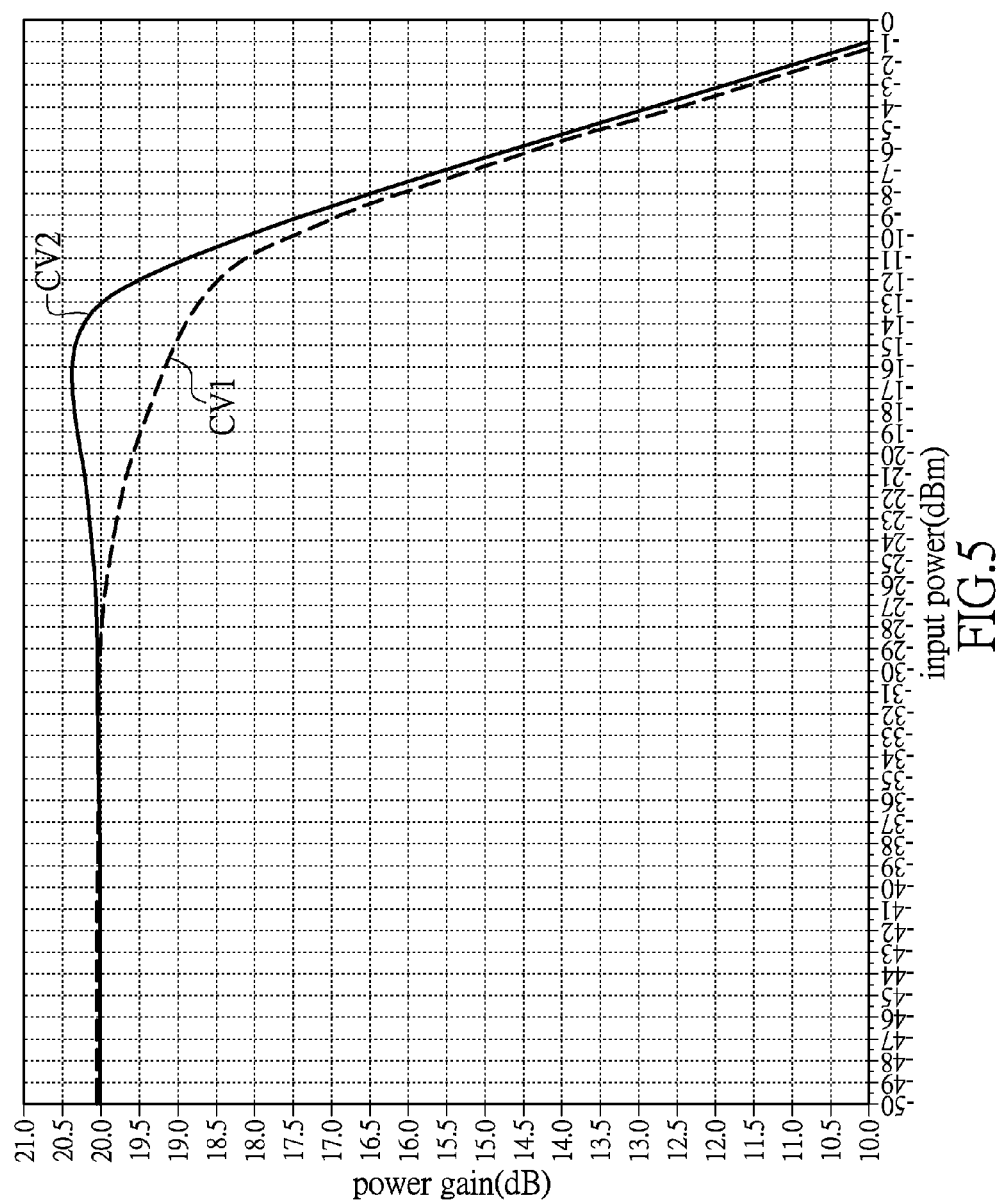
FIG. 5 shows a schematic simulation diagram of a low noise amplifier according to an embodiment of the instant disclosure.

In conjunction with FIG. 4 and FIG. 5 for understanding more about the present embodiment. FIG. 5 shows a schematic simulation diagram of a low noise amplifier according to an embodiment of the instant disclosure. In FIG. 5, a horizontal axis represents input power, a vertical axis represents power gain, curve CV1 represents a simulation curve of a traditional low noise amplifier and curve CV2 represents a simulation curve of the low noise amplifier in the embodiment shown in FIG. 4. As shown in FIG. 5, P1 dB of the traditional low noise amplifier is −15.5 dBm, P1 dB of the low noise amplifier 300 of the present embodiment is −11.3 dBm, and thus P1dB is increases by 4.2 dBm. Moreover, power gain of the low noise amplifier 300 has an increase before starting to decrease, as shown in FIG. 5.

Additionally, in the present embodiment, width-length ratio of the first transistor M1 and width-length ratio of the second transistor M2 respectively equal to width-length ratio of the third transistor M3 and width-length ratio of the fourth transistor M4, which thereby can stabilize the mapping current IM with changes of temperature or the system voltage VDD. For example, when the system voltage VDD changes between 2.5V to 3V, deviation of the mapping current IM is merely+−1.3%, and when temperature changes between −55° C.~125° C., deviation of the mapping current IM is merely+−0.18%.

[One Embodiment of the Receiver]

Figure 6:
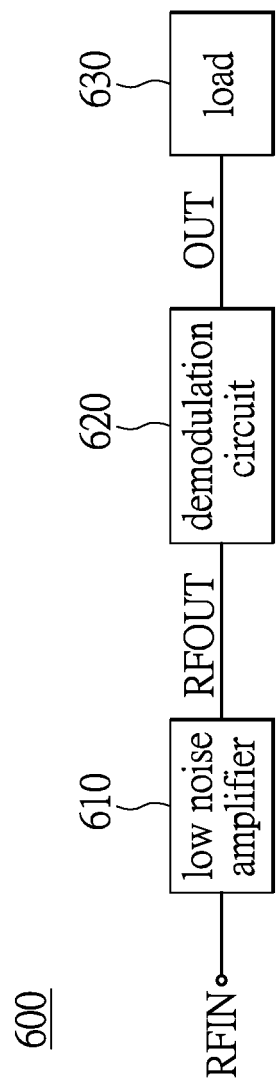
FIG. 6 shows a schematic block diagram of a receiver according to an embodiment of the instant disclosure.

Please refer to FIG. 6, FIG. 6 shows a schematic block diagram of a receiver according to an embodiment of the instant disclosure. The receiver 600 comprises a low noise amplifier 610, demodulation circuit 620 and a load 630. The demodulation circuit 620 is electrically connected to the low noise amplifier 610. The load is electrically connected to the demodulation circuit 620. The demodulation circuit 620 is used for demodulating the RF output signal RFOUT and outputting a demodulation signal OUT to the load 630. The low noise amplifier 610 may be one of the low noise amplifier 300 in the above embodiments, and receives the RF input signal RFIN from a base station via an antenna.

To sum up, the low noise amplifier and the receiver provided by the instant disclosure feedbacks the RF output signal to the current mirror circuit via the power gain compensating circuit so as to dynamically adjust the mapping current, which thereby compensates power gain of the low noise amplifier in order to increase linearity, in other words, to increase 1 dB gain compression point (P1dB).

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A low noise amplifier, comprising:
    a current mirror circuit, used for providing a mapping current;
    a bias circuit, electrically connected to the current mirror circuit, the bias circuit used for receiving a mapping current and outputting a first bias voltage and a second bias voltage according to the mapping current;
    a cascode amplifying circuit, electrically connected to the bias circuit so as to respectively receive the first bias voltage and the second bias voltage, and accordingly to work at an operation bias point, the cascode amplifying circuit used for receiving and amplifying a RF input signal and accordingly outputting a RF output signal; and
    a power gain compensating circuit, electrically connected between the cascode amplifying circuit and the current mirror circuit, the power gain compensating circuit used for receiving the RF output signal and accordingly outputting a gain compensating signal to the current mirror circuit so as to dynamically adjust current value of the mapping current, further compensating power gain of the low noise amplifier in order to increase linearity.

2. The low noise amplifier according to claim 1, wherein current value of the mapping current increases correspondingly with input power of the RF input signal increased, so as to dynamically adjust voltage values of the first bias voltage and the second bias voltage outputted by the bias circuit.

3. The low noise amplifier according to claim 1, wherein the bias circuit comprises:
    a first transistor, having drain and gate connected together for outputting the first bias voltage to the cascode amplifying circuit via a first resistor, and having source connected to a ground voltage; and
    a second transistor, having drain and gate connected together and receiving the mapping current, having source connected to drain of the first transistor, drain of the second transistor outputting the second bias voltage to the cascode amplifying circuit;
    wherein the first transistor and the second transistor dynamically adjust voltage value of the first bias voltage and the second bias voltage respectively according to current value of the mapping current.

4. The low noise amplifier according to claim 3, wherein the cascode amplifying circuit comprises:
    an input capacitor, having one terminal receiving the RF input signal;
    a third transistor, having a gate connected to drain of the first transistor via the first resistor, receiving the first bias voltage and directly connected to another terminal of the input capacitor so as to receive the RF input signal, having source connected to the ground voltage;
    a fourth transistor, having gate connected to drain of the second transistor and receiving the second bias voltage, having source connected to drain of the third transistor;
    an output capacitor, having one terminal connected to drain of the fourth transistor, having another terminal outputting the RF output signal; and
    an inductor, having one terminal connected to drain of the fourth transistor, having another terminal connected to a system voltage;
    wherein the third transistor and the fourth transistor according to the first bias voltage and the second bias voltage respectively work at the operation bias point, used for receiving and amplifying input power of the RF input signal and accordingly outputting the RF output signal.

5. The low noise amplifier according to claim 4, wherein the power gain compensating circuit comprises:
    a compensation capacitor, having one terminal connected to drain of the fourth transistor, having another terminal connected to the current mirror circuit, the compensation capacitor receiving the RF output signal and accordingly outputting the gain compensating signal to the current mirror circuit so as to dynamically adjust current value of the mapping current;
wherein the gain compensating signal is the RF output signal.

6. The low noise amplifier according to claim 5, wherein the current mirror circuit comprises:
a bias current source, having one terminal connected to the ground voltage, the bias current source having a preset current;
a fifth transistor, having gate and drain connected together and connected to another terminal of the bias current source, having source connected to the system voltage; and
a sixth transistor, having gate connected to another terminal of the compensation capacitor so as to receive the gain compensating signal, having drain connected to drain of the second transistor and outputting the mapping current, having source connected to the system voltage, wherein gate ac voltage of the sixth transistor is increased according to the gain compensating signal;
wherein gate ac voltage of the sixth transistor is to further dynamically adjust current value of the mapping current.

7. A receiver, comprising:
a low noise amplifier, used for receiving a RF input signal and outputting a RF output signal;
a demodulation circuit, electrically connected to the low noise amplifier, the demodulation circuit used for demodulating the RF output signal and outputting a demodulation signal; and
a load, electrically connected to the demodulation circuit, the load receiving the demodulation signal;
wherein the low noise amplifier comprises:
a current mirror circuit, used for providing a mapping current;
a bias circuit, electrically connected to the current mirror circuit, the bias circuit used for receiving a mapping current and outputting a first bias voltage and a second bias voltage according to the mapping current;
a cascode amplifying circuit, electrically connected to the bias circuit so as to respectively receive the first bias voltage and the second bias voltage, and accordingly to work at an operation bias point, the cascode amplifying circuit used for receiving and amplifying a RF input signal and accordingly outputting a RF output signal; and
a power gain compensating circuit, electrically connected between the cascode amplifying circuit and the current mirror circuit, the power gain compensating circuit used for receiving the RF output signal and accordingly outputting a gain compensating signal to the current mirror circuit so as to dynamically adjust current value of the mapping current, further compensating power gain of the low noise amplifier in order to increase linearity.

8. The receiver according to claim 7, wherein current value of the mapping current increases correspondingly with input power of the RF input signal increased, so as to dynamically adjust voltage values of the first bias voltage and the second bias voltage outputted by the bias circuit.

9. The receiver according to claim 7, wherein the bias circuit comprises:
a first transistor, having drain and gate connected together for outputting the first bias voltage to the cascode amplifying circuit via a first resistor, and having source connected to a ground voltage; and
a second transistor, having drain and gate connected together and receiving the mapping current, having source connected to drain of the first transistor, drain of the second transistor outputting the second bias voltage to the cascode amplifying circuit;
wherein the first transistor and the second transistor dynamically adjust voltage value of the first bias voltage and the second bias voltage respectively according to current value of the mapping current.

10. The receiver according to claim 9, wherein the cascode amplifying circuit comprises;
an input capacitor, having one terminal receiving the RF input signal;
a third transistor, having a gate connected to drain of the first transistor via the first resistor, receiving the first bias voltage and directly connected to another terminal of the input capacitor so as to receive the RF input signal, having source connected to the ground voltage;
a fourth transistor, having gate connected to drain of the second transistor and receiving the second bias voltage, having source connected to drain of the third transistor;
an output capacitor, having one terminal connected to drain of the fourth transistor, having another terminal outputting the RF output signal; and
an inductor, having one terminal connected to drain of the fourth transistor, having another terminal connected to a system voltage;
wherein the third transistor and the fourth transistor according to the first bias voltage and the second bias voltage respectively work at the operation bias point, used for receiving and amplifying input power of the RF input signal and accordingly outputting the RF output signal.

11. The receiver according to claim 10, wherein the power gain compensating circuit comprises:
a compensation capacitor, having one terminal connected to drain of the fourth transistor, having another terminal connected to the current mirror circuit, the compensation capacitor receiving the RF output signal and accordingly outputting the gain compensating signal to the current mirror circuit so as to dynamically adjust current value of the mapping current;
wherein the gain compensating signal is the RF output signal.

12. The receiver according to claim 11, wherein the current mirror circuit comprises:
a bias current source, having one terminal connected to the ground voltage, the bias current source having a preset current;
a fifth transistor, having gate and drain connected together and connected to another terminal of the bias current source, having source connected to the system voltage;
a sixth transistor, having gate connected to another terminal of the compensation capacitor so as to receive the gain compensating signal, having drain connected to drain of the second transistor and outputting the mapping current, having source connected to the system voltage, wherein gate ac voltage of the sixth transistor is increased according to the gain compensating signal;
wherein gate ac voltage of the sixth transistor is further dynamically adjusts current value of the mapping current.

* * * * *